United States Patent [19]
Heinz et al.

[11] Patent Number: 6,094,329
[45] Date of Patent: Jul. 25, 2000

[54] DI PROTECTIVE SWITCHING DEVICE

[75] Inventors: Klaus Dieter Heinz, Hanau; Stefan Thiele, Kahl am Main, both of Germany

[73] Assignee: Heinrich Kopp AG, Germany

[21] Appl. No.: 09/415,046

[22] Filed: Oct. 7, 1999

Related U.S. Application Data

[63] Continuation of application No. 08/852,848, May 7, 1997, abandoned.

[30] Foreign Application Priority Data

May 7, 1996 [DE] Germany .................. 196 18 279

[51] Int. Cl.⁷ .................................................. H02H 3/16
[52] U.S. Cl. ............................................. 361/45; 361/42
[58] Field of Search .................. 361/42–50, 56, 361/57; 307/326, 327; 324/525, 541

[56] References Cited

U.S. PATENT DOCUMENTS 4,029,996  6/1977  Miffitt ................................ 307/326
4,364,007  12/1982  Cutler et al. ........................ 324/51

FOREIGN PATENT DOCUMENTS

| 0 189 493 | 6/1986 | European Pat. Off. ....... H01H 83/00 |
| 2 643 195 | 8/1990 | France .......................... H02H 3/26 |
| 2 204 199 | 11/1988 | United Kingdom ............. H02H 3/33 |

*Primary Examiner*—Ronald W. Leja
*Attorney, Agent, or Firm*—Skjerven, Morrill, MacPherson, Franklin & Friel LLP; Alan H. MacPherson; Norman R. Klivans

[57] ABSTRACT

A DI fault current leakage guard switching device for detecting improperly wired networks or missing connections includes a totalizing current transformer for detecting fault currents in a phase conductor line and a neutral conductor line, a switching stage, a DI guard switch, and a detecting unit for detecting fault conditions of a protective earth conductor line. The detecting unit receives signals on the phase conductor line, neutral conductor line and protective earth conductor line, respectively. The detecting unit is connected to the switching stage for controlling the DI guard switch.

11 Claims, 2 Drawing Sheets

DI PROTECTIVE SWITCHING DEVICE

CROSS-REFERENCE TO RELATED APPLICATION

The present application is a continuation of U.S. patent application Ser. No. 08/852,848, filed May 7, 1997, incorporated herein by reference, now abandoned.

The invention relates to a DI fault current leakage guard switching device.

Fault current leakage guard switches are mechanical switching devices intended for interrupting associated circuits by opening contacts upon occurrence of fault currents. A fault current leakage guard switch for monitoring electric circuits for isolation, which includes a totalizing current transformer including a primary winding, which is formed by a phase conductor and a neutral conductor, and a secondary winding, is known from the European Patent EP 0655 820 A1. The secondary winding detects the fault current and controls a relay, via an amplifier and a threshold circuit, acting upon switching contacts.

Fault current leakage guard switches, in which the functions of detection, evaluation or disconnection from the mains voltage, are referred to as AC-independent DI fault current leakage guard switches. Such a protective switch detects the necessity of clearing with control of all poles, i.e. inclusive of the earthed conductor (PE) by sensing when either the difference between the inflowing and out-flowing currents via the phase conductor (L) and the neutral conductor (N) or the current flowing through the nonfused earthed conductor (PE) exceeds a determined amount.

The fault current leakage guard switches so far known are not capable of detecting various fault situations linked up with the non-fused earthed conductor (PE). For instance, a break, i.e. the non-existence of the non-fused earthed conductor (PE), cannot be detected because when the non-fused earthed conductor (PE) is broken or a section thereof is missing, a current can actually flow through such a conductor. In the event of a fault in an appliance connected to the main circuit, e.g. a portable drill held by a craftsman, it is hence only possible to cause the fault current leakage guard switch via the craftsman as the sole conductor. In cases where an external phase is spot-drilled it is not ensured that the emergency current path along the non-fused earthed conductor will be available.

Moreover, with an improperly connected non-fused earthed conductor (PE), the fault current leakage guard switches are not able to detect the mains voltage on the non-fused earthed conductor (PE) and use it for release. In such a case the fault current leakage guard switch produces a circuit interruption only when a current of a defined intensity flows via the housing of the connected appliance and via the craftsman, for instance. As this current initially flows at full mains voltage a very high critical initial body current arises which is limited only by the physical resistance. This initial body current may be lethal for the user.

The invention is therefore based on the problem of enhancing a fault current leakage guard switch of the type described by way of introduction in a way that the aforementioned disadvantages will be avoided and that, in particular, fault conditions of the non-fused earthed conductor (PE) will be detected.

The invention provides a DI fault current leakage guard switching device comprising a totalizing current transformer for detecting fault currents in a phase conductor and a neutral conductor and a DI switch, further comprising a means for detecting the condition of the non-fused earthed conductor, which is connected on the input side to said phase, neutral and non-fused earthed conductors and on the output side to a switching stage for controlling said DI guard switch.

The inventive fault current leakage guard switch detects fault conditions in relation to the non-fused earthed conductor and causes a release of the main circuit with control of all poles. According to the present invention, the detection of a live PE conductor requires an approximation in terms of potential relative to ground at a sensor, and which is achieved, for instance, by an ohmic and/or capacitive impedance, when for e.g. a user touches an ON push button made of a conductive material.

The inventive fault current leakage guard switch is used to detect improperly wired networks or missing connections, without the application of an auxiliary winding on the transducer. In the event of a fault the guard switch can no longer be operated so as to provide an additional protection to the user from faults on the PE conductor.

In the following, a preferred embodiment of the invention will be described with references to the drawings.

IN THE DRAWING

Figure 1:
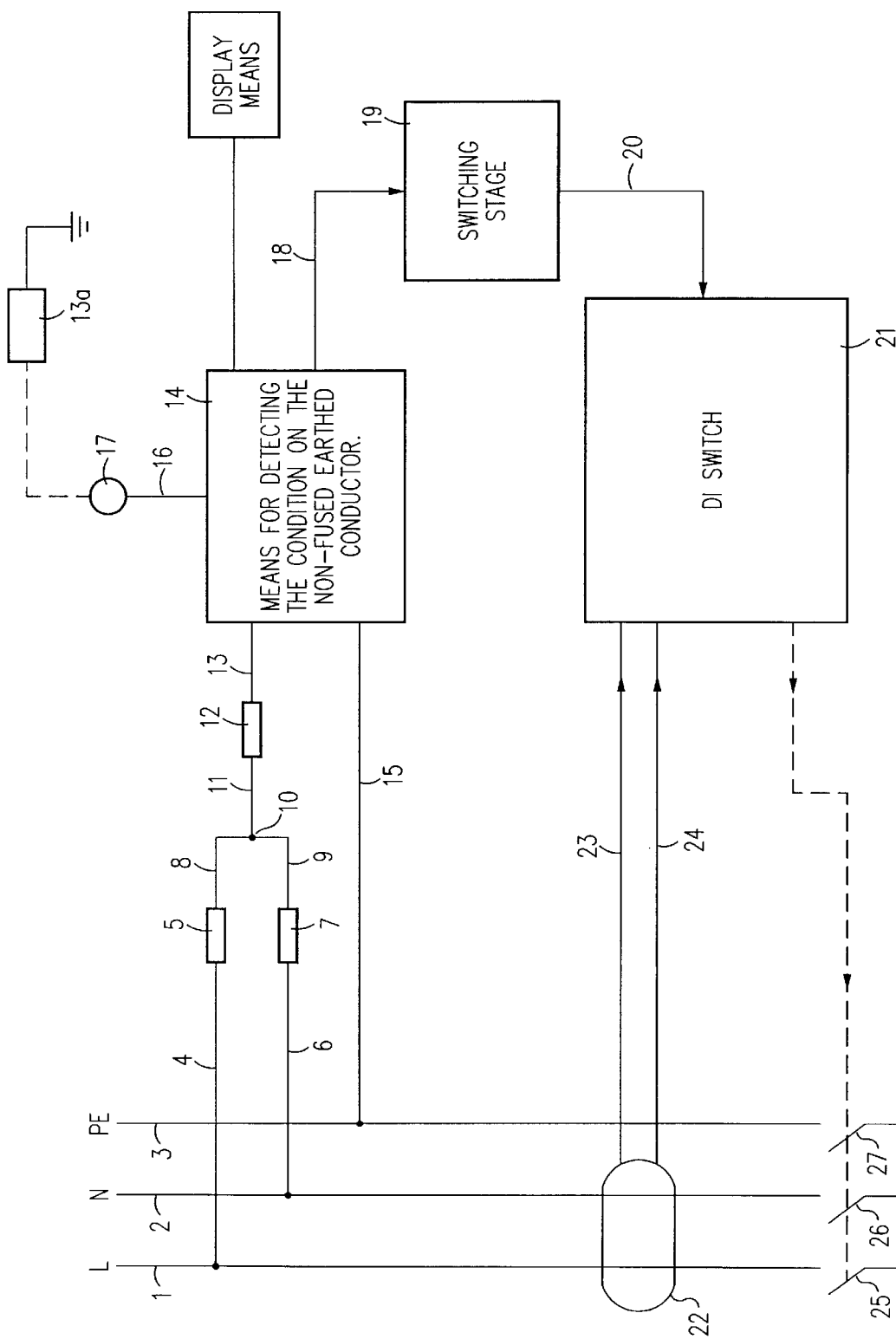
FIG. 1 is a block diagram of a DI fault current leakage guard switch in accordance with the invention.

The block diagram in FIG. 1 shows a preferred embodiment of a fault current leakage guard switch in accordance with the invention.

In FIG. 1 the phase conductor is identified by numeral 1, the neutral conductor by numeral 2 and the non-fused earthed conductor by numeral 3.

The L-phase conductor 1 is connected, via a line 4, to a protective impedance 5, and the N-neutral conductor 2 is connected, via a line 6, to a protective impedance 7. The protective impedances 5, 7 are interconnected, at their output ends, via conductors 8, 9 at a branch point 10. The point 10 is connected, via a line 11, to another protective impedance 12 which is connected, through a conductor 13, to a means 14 for detecting the condition of the nonfused earthed conductor. The protective impedances 5, 7 and 12 are provided for current limitation. The means 14 is moreover connected, via a line 15, to the non-fused earthed conductor 3 and, via a line 16, to a sensor 17. The sensor 17 is a push button made of a conductive material, which must be touched by an operator. The sensor 17 is disposed, for instance, on the housing of the connected appliance.

The output of the means 14 is connected, via a conductor 18, to a switching stage 19 which activates a DI fault current leakage guard switch 21 via a line 20. The DI fault current leakage guard switch 21 is connected to a totalizing current transformer 22 having a primary winding which is formed by the phase conductor 1 and the neutral conductor 2. The totalizing current transformer 22 moreover includes a secondary winding which carries induced voltages via lines 23, 24 to an electronic scoring circuitry included in the DI switch 21. The DI switch 21 is mechanically linked up with switching contacts 25, 26, 27 which are connected into the lines 1, 2, 3. The complete system as illustrated in FIG. 1 constitutes the DI protective switching device.

The mode of operation of the inventive fault current leakage guard switch, which is illustrated in FIG. 1, will be described in the following.

Depending on the phase relationship, there is a flow of current either from line 4 via the protective impedance 5 and the line 8 or from the line 6 via the protective impedance 7 and the line 9 to the branch point 10, and from the branch point 10 via the conductor 11, the protective impedance 12, the conductor 13, the means 14 and the line 15 to the non-fused earthed conductor 3. In regular cases, i.e. when the phase conductor 1, the neutral conductor 2 and the non-fused earthed conductor 3 are properly connected, this current is carried off through the means 14 via the line 15 to the non-fused earthed conductor 3.

When, however, this current is missing, e.g. because the non-fused earthed conductor 3 is not connected or interrupted the means 14 detects this fault condition, based on the current which does not flow off via the conductor 15 to the non-fused earthed conductor 3, and operates the DI guard switch 21 via a switching stage 19, which is isolated in terms of potential, with the DI guard switch 21 opening the switching contacts 25, 26, 27 and hence interrupting the conductors 1, 2, 3 with control of all poles.

Furthermore, the means 14 is able to detect another fault condition, i.e. the presence of a phase or mains voltage on the nonfused earthed conductor 3. To this end, the sensor surface 17 is provided which is made of a conductive material. When handling the appliance which the inventive fault current leakage guard switch is connected to, the user touches the sensor surface 17 such that an approximation in terms of potential relative to ground is induced via the user's impedance 17a at the sensor 17. When a phase or mains voltage is applied on the non-fused earthed conductor 3 a potential difference is generated relative to the sensor surface 17, which on account of the user touching it is approximately at the level of ground potential; this potential difference is detected as a fault condition by the means 14. When this fault condition is detected the means 14 operates the DI switch 21, via the switching stage 19, which switch then opens the switching contacts 25, 26, 27.

Figure 2:
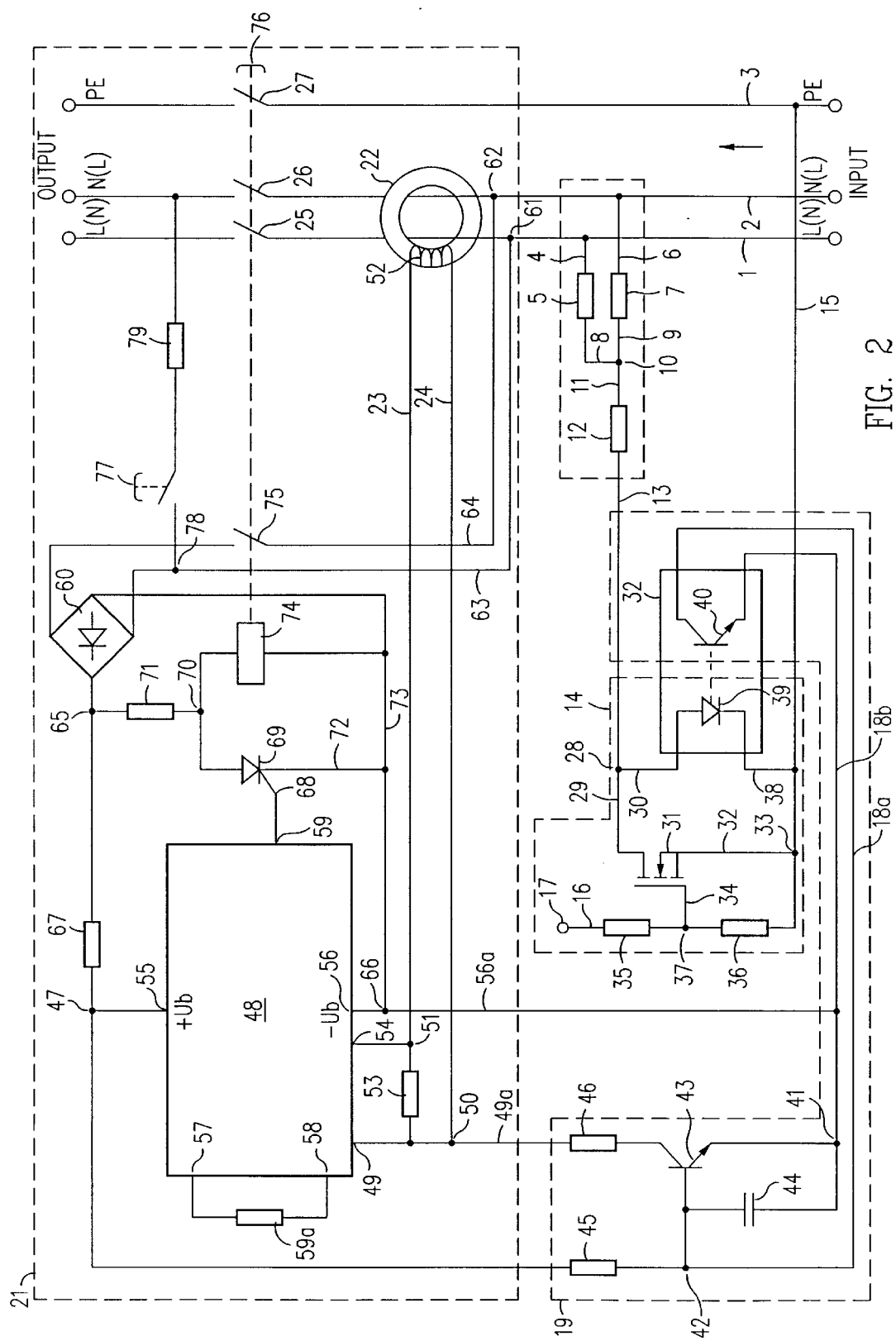
FIG. 2 shows a detail of the DI fault current leakage guard switch illustrated in FIG. 1.

FIG. 2 shows a detail of the preferred DI fault current leakage guard switch detecting the condition on the non-fused earthed conductor in accordance with the invention, which is illustrated in FIG. 1. Identical reference numerals denote identical components in FIGS. 1 and 2.

First, the precise structure of the inventive fault current protective switching device which detects of the condition on the non-fused earthed conductor will be described, which is illustrated in FIG. 2.

The protective impedances 5, 7, 12 are connected, via line 13, to the means 14 for detecting the condition of the non-fused earthed PE conductor 3. The line 13 branches in the means 14 at a branching point 28 into two line sections 29, 30 whereof the first line section 29 is connected to a semiconductor switch 31 and the second line section 30 is connected to a potential-isolating stage 32. The semiconductor switch 31 is preferably a MOSFET device, e.g. a self-blocking n-channel MOSFET element as illustrated in FIG. 2. The line 29 is connected to the DRAIN terminal of the MOSFET element 31. The SOURCE and ground terminals of the MOSFET device 31 are interconnected and are connected, via a line 32, to the branch point 33 with the line 15 which leads to the non-fused earthed conductor 3. The gate of the semiconductor switch 31 is connected via a line 34 to a branch point 37 disposed between a protective resistor 35 and an operating resistor 36. The protective or leakage resistor 35 is connected via line 16 to the sensor 17.

The operating resistor 36 is connected between the branch points 33 and 37. The potential-isolating stage 32 is disposed in the means 14. The potential-isolating stage is connected, on its input side and via the lines 30, 38, between the branch point 28 and the line 15 leading to the non-fused earthed PE conductor 3. The potential-isolating stage 32 illustrated in FIG. 2 is preferably constituted by an opto coupler. The isolation of potentials between the means 14 and the downstream switching stage 19 may, however, also be achieved by means of any other potential-isolating devices such as triac couplers, opto field effect transistors, piezo couplers, transformers or relays. The potential-isolating stage 32 in the form of an opto coupler comprises, on its input side, a light-emitting diode 39 which is disposed between the lines 30 and 38. The potential-isolating stage 32 comprises, on its output side, a photosensitive transistor 40 which becomes conductive when it receives light emitted by the light-emitting diode 39. The emitter of the transistor 40 is connected, via a line 18b, to the branch point 41 whilst the collector of the transistor 40 is connected, via a line 18a, to the branch point 42 of the switching stage 19. The switching stage 19 comprises a semiconductor switch 43, e.g. an npn-type transistor as illustrated in FIG. 2. The base of the transistor 43 is connected to a branch point 42 and the emitter of transistor 43 is connected to the branch point 41. A smoothing capacitor 44 is connected in parallel with the base-emitter junction of the transistor 43 between the branch points 41 and 42. The switching stage 19 includes furthermore two current-limiting resistors 45, 46 for the semiconductor switch 43. The first current-limiting resistor 45 is disposed between the base 42 of the semiconductor switch 43 and a branch point 47 to which the potential of a positive operating voltage ($+U_b$) of an integrated circuit 48 is applied. The second current-limiting resistor 46 of the switching stage 19 is connected between the collector of the semiconductor switch 43 and via a line 49a to a branch point 50. A secondary winding 52 of the totalizing current transformer 22 is connected, via the line 23, to the branch point 51 and, via the line 24, to the branch point 50. A transducer terminating impedance 53 is connected between the two branch points 50, 51 in parallel with the secondary winding 52. The branch point 50 is connected to a terminal 49 whilst the branch point 51 is connected to a point of connection 54 of the integrated circuit 48. The supply voltage is fed to the integrated circuit 48 via two operating voltage terminals 55, 56 whereof the first terminal 55 is at a positive operating voltage level ($+U_b$) and the second terminal 56 is at a negative operating voltage level ($-U_b$). The two operating voltage terminals 55, 56 of the integrated circuit 48 are connected via a succession of Z-diodes connected in series and which serve to stabilize the IC. The point of connection 49 is connected to an IC-internal branch point which is disposed in the middle of the Z-diode succession. Hence the potential at the point of connection 49 corresponds to half of the operating voltage and constitutes a reference potential. The power supply of the integrated circuit 48 via the terminals 55, 56 is rectified by a rectifier circuit 60 which taps the alternating voltage on the phase conductor 1 and the neutral conductor 2 at the points 61, 62 via the conductors 63, 64, rectifies it, and provides a DC voltage between the branch points 65 and 66. The branch point 65 is connected via a current-limiting resistor 67 to the branch point 47 which supplies the positive operating voltage ($+U_b$) to the IC 48 at the terminal 55. The branch point 66 supplies the IC 48 via the terminal 56 with the negative operating voltage ($-U_b$). The integrated circuit 48 comprises furthermore two additional terminals 57, 58 between which a variable resistor 59a is connected. The variable resistor 59a may be used to adjust the responsiveness of the integrated circuit 48 and hence the triggering threshold of the DI switch 21.

The integrated circuit 48 comprises an output terminal 59 for supplying control pulses, which terminal is connected via a control line 68 to a semiconductor switch 69, preferably a thyristor. The control line 68, which originates from the output terminal 59 of the IC 48, controls the gate of the thyristor 69. The anode of the thyristor 69 shown in FIG. 2 is connected to a branch point 70 which is at the positive DC potential, via a current-limiting resistor 71, at the branch point 65. The cathode of the thyristor 69 is connected to a connecting line 73 via a line 72 between the rectifier circuit 60 and the branch point 66. A no-voltage release relay 74 is connected in parallel with the thyristor 69 between the branch point 70 and the line 73. The no-voltage release relay 74 is mechanically linked up to the switching contacts 25, 26, 27 of the conductors 1, 2, 3 as well as to a switch 75 which may be used to interrupt the conductor 64. The contacts 25, 26, 27 as well as the switch 75 are provided for operation by means of an ON-push button 76 or a switch handle, respectively, for activation of the guard switch. The DI switch 21 further comprises moreover a test key 77 which is connected, on the one hand, via the branch point 78 to the operating current lead 63 and, on the other hand, to the neutral conductor 2, via series resistor 79 for adjusting a testing current.

The mode of operation of the inventive fault current leakage guard switch with detection of the condition on the non-fused earthed conductor will be explained in the following with reference to the preferred embodiment which is illustrated in FIGS. 1 and 2.

The fault current leakage guard switch is operative in normal operation, with the non-fused earthed conductor 3 properly connected, without occurrence of a phase on the non-fused earthed conductor 3, and without fault current flowing on the output or load side, respectively.

Depression of the push button or switch handle 76 causes the switching contacts 25, 26, 27 to close thereby through connecting the input voltage via the conductors 1, 2, 3 to the output or load side, respectively. Depression of the push button 76 causes, at the same time, the switch 75 to close, which results in the supply of an operating current via the operating current lead 64 to the rectifier circuit 60. The rectifier circuit 60 provides a positive voltage at the branch point 65 and, after a corresponding voltage drop across the current-limiting resistor 71, at the branch point 70. As a result the no-voltage release relay 74 attracts and maintains the contacts 25, 26, 27 as well as 75 in closed state upon release of the push button 76.

Upon occurrence of a fault current on the phase conductor 1 and the neutral conductor 2 a current is induced in the secondary winding 52 of the totalizing current transformer 22 whose primary windings are formed by the conductors 1 and 2. The current so induced is passed through the lines 23, 24 and produces a voltage drop across the terminating impedance 53 of the totalizing current transformer 22. As a result of the voltage drop across the resistor 53 the integrated circuit 48 receives a signal, via the terminals 49 and 54, which signal is representative of the magnitude of the fault current. The responsiveness of the integrated circuit 48, and hence the level of the trigger threshold, may be adjusted through the variable resistor 59a. When the voltage between the terminals 49 and 54, or the voltage across the terminating impedance 53, respectively, exceeds the set trigger threshold the integrated circuit 48 issues, via its output 59 and on the control line 68, a control signal to the gate of the thyristor 69 so as to trigger thyristor 69. The triggered thyristor 69 shorts out the no-voltage release relay 74, which is connected in parallel thereto, which causes the relay to drop out and open the switching contacts 25, 26, 27 as well as the switch 75. The opening of the switching contacts 25, 26, 27 interrupts the conductors 1, 2, 3 and hence isolates the output side of the fault current leakage guard switch from the input. At the same time, the opening of the switch 75 discontinues the voltage supply to the fault current leakage guard switch.

Furthermore, the inventive fault current leakage guard switch presents additional protective functions because it detects also fault conditions other than the occurrence of a fault current. Employing the means 14, the fault current leakage guard switch detects a non-fused earthed PE conductor 3 when it is not connected or interrupted, respectively, as well as it detects the presence of a voltage or phase, respectively, on the non-fused earthed PE conductor 3 as additional fault conditions.

In normal operation, with proper connection of the non-fused earthed conductor 3—as has been explained with reference to FIG. 1—a current is carried off via the protective impedances 5, 12 or 7, 12 via the line 13 through the line 30, the light-emitting diode 39 of the potential-isolating stage 32, as well as through the lines 38 and 15 to the non-fused earthed conductor 3, which depends on the phase relationship. The emission of light from diode 39 causes the through-connection of the photosensitive transistor 40 of the go potential-isolating stage 32 and the shorting of the base-emitter junction of the transistor 43 in the switching stage 19. The shorting of the branch points 41 and 42 in the switching stage 19 prevents the smoothing capacitor 44 from charging through the cur-rent-limiting resistor 45 at positive potential, and causes the transistor 43 to cut off. The cut-off transistor 43 prevents a short between the connecting point 49 and the terminal 56, which is at negative operating potential (−U$_b$), via the line 49a, the resistor 46 as well as through the line 56a. In this way, the balance of the operating potentials of an IC-internal window comparator is retained whilst the IC 48 does not issue a control pulse through the control line 68 to the thyristor 69 which hence remains in the cut-off condition and does not short the relay 74.

As a result of the aforedesdribed succession of effects the switching contacts 25, 26, 27 as well as 75 remain in the closed condition as long as a current is carried off on the input side via the potential-isolating stage 32 in the means 32, and as long as the totalizing current transformer 22 does not detect a fault current.

If, however, the non-fused earthed conductor 3 is not corrected or presents a break the current supplied through the line 13 is not carried off to the line 15. In such a fault condition there is no current flowing through the light-emitting diode 39 which, as a consequence, is turned off and hence turns off the photosensitive transistor 40. As a result, the short between the branch points 41 and 42 in the switching stage 19 is terminated and the capacitor 44 is charged via the resistor 45 which is at positive operating voltage potential at the branch point 47. The base-emitter potential of the semiconductor switch 43 rises up to a defined potential level and renders the transistor 43 conductive. This produces a shorting of the reference point 49 and the terminal 56 of the integrated circuit 48 via the lines 49a, the resistor 46, the transistor 43 as well as the line 56a. As a result, an unbalance of the supply voltages is induced at the IC-internal window comparator which issues a control pulse at output 59 which delivers the pules via the control line 68 to the gate of the thyristor 69. The control pulse causes the thyristor 69 to fire and to become conductive. The no-voltage trigger 74, which is connected in parallel with the thyristor 69, is shorted and drops out, which causes the switching contacts 25, 26, 27 as well as 75 to open.

If a non-fused earthed conductor 3 is not connected or presents a break this condition hence causes the triggering of the switching contacts 25, 26, 27 are immediately, with an immediate reliable isolation of the voltage input from the load-side output. The inventive fault current leakage guard switch with detection of the condition on the non-fused earthed conductor can hence not be activated by means of the push button 76 when the non-fused earthed conductor 3 is not connected.

In another embodiment, which is not illustrated here, a display means is provided for informing the operator about the situation that the non-fused earthed conductor 3 is not connected or presents a discontinuity, respectively.

The means 14 detects the application of a voltage or a phase, respectively, on the non-fused earthed conductor 3 as a further fault condition, in addition to a discontinuous or non-connected non-fused earthed conductor 3.

If the non-fused earthed conductor 3 carries the mains voltage even though the fault current leakage guard switch is properly connected—e.g. on account of PEN interchange—a current which is carried off through the line 15 is passed, depending on the phase relationship, either via the line 38, through the light-emitting diode 39 and the line 30 to line 13 or via the line 32, through the semiconductor switch 31 and the line 29 to the line 13 and which subsequently flows from there through the protective impedances 12, 7 or 5 to the neutral conductor 2. The n-channel MOSFET device 31, which is shown in FIG. 2, is provided with an internal substrate diode and hence limits the negative half-waves whilst the positive half-waves control the photosensitive transistor 40 of the potential-isolating stage 32 via the light-emitting diode 39. A through-controlled transistor 40 corresponds initially to the normal operating state, prevents the semiconductor switch 43, which is included in the switching stage 19, from becoming conductive and hence bars triggering of the DI switch 21. If, however, the metal sensor surface or ON push button 17, respectively, is touched by a user the gate of the semiconductor switch 31 is drawn towards ground potential via the line 34, the leakage resistor 35, the line 16, the sensor surface 17 as well as the user's impedance 17a, which is not illustrated in FIG. 2. As a result, the semiconductor switch 31 becomes conductive and shorts the light-emitting diode 39. This causes the transistor 40 to turn off and the smoothing capacitor 44 in the switching stage 19 to be charged via the resistor 45. The transistor 43 in the switching stage 19 becomes conductive and an unbalance of the supply voltage is triggered at the IC-internal window comparator. The IC 48 issues a control pulse via the control line 68 to the gate of the thyristor 69 which fires and shorts the no-voltage release relay 74. The shorted relay drops and opens the switching contacts 25, 26, 27 as well as switch 75.

If hence a mains voltage is applied to the non-fused earthed conductor 3 this fault condition is detected by the means 14 when the user touches the sensor surface 17, which results in the immediate isolation of the load-side output from the input of the fault current leakage guard switch. In the case of a live non-fused earthed conductor 3 the inventive fault current leakage guard switch does not become operative as late as by the time by which a fault current has leaked already to ground via the user or craftsman, respectively, but in such a case the fault current leakage switch is preferably in-operative.

An additional advantage of the present invention is that there is no disconnection when an external phase is spot-drilled, which means that the protection via connected PE conductors is retained.

The fault current leakage guard switch, which has been described in the foregoing with references to FIGS. 1 and 2, serves to detect improperly wired networks or missing connections, without auxiliary windings on the totalizing current transformer 22. In the event of a fault the inventive fault current leakage guard switch can no longer be operated and thereby ensures an additional protection of the user against faults in the connection of the non-fused earthed conductor 3, against breaks of the non-fused earthed conductor 3, as well as against occurrence of the mains voltage on the nonfused earthed conductor 3. In the fault current leakage guard switches known in the art faults were not detected and considered. Additional auxiliary windings on the totalizing current transformer 22 could be omitted in spite of the extended protective functions because the electronic means 14 for detecting the condition on the non-fused earthed conductor acts upon the IC 48, which is provided in the DI switch 21, directly via the switching stage 19, rather than by permitting the flow of a fault current through auxiliary windings.

In another embodiment, which is not illustrated here, an electronic scoring circuitry informs the user about the cause of triggering when the fault current leakage guard switch is triggered or about the reason why the fault current leakage guard switch cannot be operated when the fault current leakage guard switch cannot be started. A display means is connected to the electronic scoring circuitry for indicating to the user whether the DI switch 21 has been triggered or cannot be started on account of the occurrence of a fault current, a break on the non-fused earthed PE conductor 3 or non-connection thereof, or as a result of a mains voltage present on the non-fused earthed conductor. This indication facilitates the elimination of the cause of the fault by the user considerably.

What is claimed is:

1. A residual current operated circuit breaker being functionally dependent on a mains voltage, comprising:

a totalizing current transformer for detecting fault currents in a phase conductor line and a neutral conductor line;

a switching stage;

a circuit breaker-guard switch; and a detecting means for detecting fault conditions of a protective earth conductor line, said detecting means receiving signals on said phase conductor line, neutral conductor line and protective earth conductor line, respectively, said detecting means being connected to said switching stage for controlling said circuit breaker-guard switch, wherein said fault conditions of said protective earth conductor line comprise as a first fault condition the interruption or disconnection of the protective earth conductor line and as a second fault condition the presence of a phase or mains voltage on the protective earth conductor line which is detected by detecting a potential difference generated relative to a sensor made of a conductive material, when said sensor is touched by an operator.

2. Residual current operated circuit breaker according to claim 1, wherein said detecting means detects the first fault condition by detecting that a current supplied to said detecting means from said phase conductor line is not carried off via a shunt of conductor line to said protective earth conductor line.

3. Residual current operated circuit breaker according to claim 1, wherein said detecting means is connected via a shunt off conductor line to said protective earth conductor line.

4. Residual current operated circuit breaker according to claim 1, wherein said detecting means comprises a potential-isolating stage connected in parallel with a switching means.

5. Residual current operated circuit breaker according to claim 4, wherein said potential-isolating stage is formed by a component selected from a group comprising opto coupler, a triac coupler, an opto field effect transistor, a piezo coupler and a relay.

6. Residual current operated circuit breaker according to claim 5, wherein said switching stage comprises a semiconductor switching component.

7. Residual current operated circuit breaker according to claim 5, wherein said switching stage comprises a smoothing capacitor.

8. Residual current operated circuit breaker according to claim 4, wherein said potential-isolating stage is formed by a component selected from a group comprising opto coupler, an opto field effect transistor, a piezo coupler and a relay, and wherein a sensor is connected to a control electrode of said switching means via a protective resistor.

9. Residual current operated circuit breaker according to claim 1, wherein a display means is connected to said detecting means for indicating the type of the fault condition detected by said detecting means.

10. Residual current operated circuit breaker according to claim 1, further comprising protective impedances for current limitation, said protective impedances being connected between each of said phase and said neutral conductor lines and said detecting means.

11. Residual current operated circuit breaker according to claim 10, wherein a reference potential for said circuit breaker-guard switch is generated by said switching stage independently of the connection of the detecting means to said phase conductor line and said neutral conductor line via said protective impedances.

* * * * *

UNITED STATES PATENT AND TRADEMARK OFFICE
CERTIFICATE OF CORRECTION

PATENT NO. : 6,094,329
DATED : July 25, 2000
INVENTOR(S) : Heinz et al.

It is certified that error appears in the above-identified patent and that said Letters Patent is hereby corrected as shown below:

Title page,
Item [63], please delete the word "abandoned" and substitute -- Pat. No. 6,091,591 --.

Signed and Sealed this

Eleventh Day of December, 2001

Attest:

*Nicholas P. Godici*

NICHOLAS P. GODICI
*Acting Director of the United States Patent and Trademark Office*

*Attesting Officer*